United States Patent [19]
Nishimoto

[11] Patent Number: 5,641,609
[45] Date of Patent: Jun. 24, 1997

[54] METHOD FOR MANUFACTURING PATTERN LAYER HAVING DIFFERENT MINIMUM FEATURE SIZES

[75] Inventor: Shozo Nishimoto, Tokyo, Japan

[73] Assignee: NEC Corporation, Tokyo, Japan

[21] Appl. No.: 339,732

[22] Filed: Nov. 14, 1994

[30] Foreign Application Priority Data

Nov. 11, 1993 [JP] Japan ................. 5-305767

[51] Int. Cl.$^6$ .................................... G03F 7/00
[52] U.S. Cl. .................. 430/313; 430/311; 430/396; 438/948
[58] Field of Search ................. 430/311, 313, 430/396; 437/229; 156/659.11

[56] References Cited

U.S. PATENT DOCUMENTS

| | | |
|---|---|---|
| 4,904,569 | 2/1990 | Fukuda et al. ............ 430/311 |
| 5,455,130 | 10/1995 | Kamon ........................... 430/5 |
| 5,494,780 | 2/1996 | Nakashima et al. ........ 430/313 |

FOREIGN PATENT DOCUMENTS

| | | |
|---|---|---|
| 60-7431 | 1/1985 | Japan. |
| 1147458 | 6/1989 | Japan. |

*Primary Examiner*—John A. McPherson
*Attorney, Agent, or Firm*—Sughrue, Mion, Zinn, Macpeak & Seas

[57] ABSTRACT

In a method for manufacturing a semiconductor device, layer including a first portion having a first height and a second portion having a second height different from the first height is formed on a substrate. Then, an image formation beam is irradiated onto the layer to form first and second patterns on the first and second portions, respectively. A minimum feature size of the first pattern is different from that of the second pattern.

11 Claims, 14 Drawing Sheets

METHOD FOR MANUFACTURING PATTERN LAYER HAVING DIFFERENT MINIMUM FEATURE SIZES

BACKGROUND OF THE INVENTION

1. Field of the Invention

The present invention relates to a method for manufacturing a semiconductor device including a pattern layer having different minimum feature sizes formed by using an image forming beam such as an optical beam and an electron beam.

2. Description of the Related Art

In a method for manufacturing a semiconductor device, photolithography technology or electron beam exposure technology has been used to form a fine pattern layer. For example, in the photolithography technology, if $\lambda$ is the wavelength of an optical source and NA is the numerical aperture of a lens of a projector, then a resolving power R is represented by $$R = k_1 \lambda / NA$$

where $k_1$ is constant dependent upon a photoresist process. Therefore, in manufacturing an ultra-large scale integrated (ULSI) circuit using a half-micron design rule, or the like, the wavelength of the optical sources has been changed from $\lambda=436$ nm (g-line) to $\lambda=365$ nm (i-line) to thereby enhance the resolution power R.

However, since depth of focus (DOF) is represented by $$DOF = k_2 \lambda / (NA)^2$$

where $k_2$ is also a constant dependent upon the photoresist process, the depth of focus has been reduced as the resolution power R has been increased.

At the same time, in order to obtain a fine-structured, multi-functional and highly-functional ULSI circuit, the surface of a layer has been made very rough, i.e., a largely-stepwise layer has been formed. As a result, a substantial resolution power has been reduced as compared with the original resolution power. Therefore, only a less fine-structured pattern can be resolved. For example, in a stacked-capacitor-type dynamic random access memory (DRAM), a capacitor electrode made of polycrystalline silicon is made thick enough to compensate for a reduction of its capacitance due to its fine structure. As a result, a step larger than 1 μm is generated in insulating layer between a memory cell portion and a peripheral portion thereof. This reduces the resolution power.

Thus, in a semiconductor device including a largely stepwise layer, the minimum feature size is larger than originally determined by the resolution power of the optical source or electron beam, and therefore, the minimum feature size cannot be reduced.

In order to substantially reduce the minimum feature size for a largely-stepwise layer, a first prior art method uses a photomask (or reticle) that has two different level optical shields (see JP-A-SHO60-7431). This will be explained later in detail. In the first prior art method, however, it is difficult to manufacture such a photomask (or reticle) for a continuous stepwise surface portion of the stepwise layer. This reduces the manufacturing yield and increases the manufacturing cost.

A second prior art method uses a photomask (or reticle) formed by a glass substrate, a phase shift layer formed on the glass substrate, and an optical shield layer formed on the phase shift layer (see JP-A-HEI1-147458). This will be also explained later in detail. In the second prior art method, however, the thickness or refractive index of the phase shift layer has to be changed in accordance with the level of the stepwise layer, which reduces time manufacturing yield and increases the manufacturing cost. Also, the selection of material for the phase shift layer is difficult.

SUMMARY OF THE INVENTION

It is, therefore, an object of the present invention to provide a method for manufacturing a semiconductor device including a largely-stepwise layer, which has a high manufacturing yield and a low manufacturing costs.

According to the present invention, in a method for manufacturing a semiconductor device, a layer including a first portion having a first height and a second portion having a second height different from the first height is formed. Then, an image formation beam is irradiated onto the layer, to form first and second patterns on the first and second portions, respectively. A minimum feature size of the first pattern is different from that of the second pattern. This method can be carried out without modifying a conventional photomask (or reticle), thus reducing the manufacturing cost.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENTS

Before the description of the preferred embodiments, prior art manufacturing methods will be explained with reference to FIGS. 1, 2A, 2B and 2C.

Figure 1:
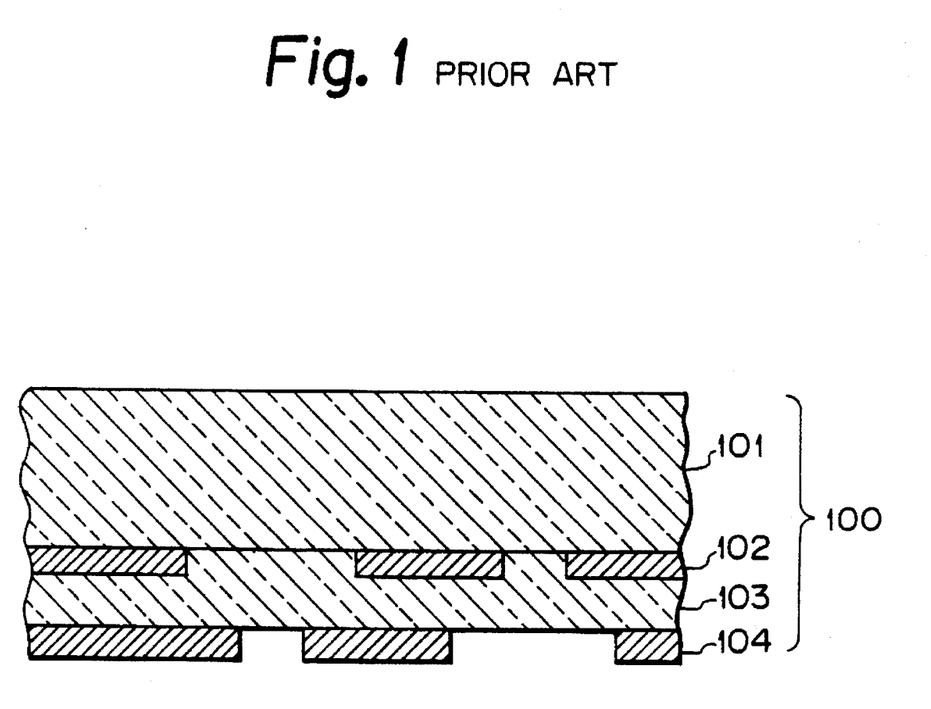
FIG. 1 is a cross-sectional view illustrating a photomask (or reticle) for explaining a first prior art method for manufacturing a semiconductor device.

In FIG. 1, which shows a first prior art. manufacturing method, a photomask (or reticle) 100 is used which has two different level optical shields (see JP-A-SHO60-7431). That is, the photomask 100 is constructed using a glass substrate 101, an optical shield 102 formed on the glass substrate 101, a glass substrate 103, and an optical shield 104 formed on the glass substrate 103. The optical shield 102 provides a first pattern for a first portion of a semiconductor device (not. shown), and the optical shield 104 provides a second pattern for a second portion of the semiconductor device. In this case, although the height of the first portion is different from that of the second portion, this difference is compensated for by the distance between the optical shields 102 and 104.

In the manufacturing method as shown in FIG. 1, however, as stated above, it is difficult to manufacture such a photomask (or reticle) for a continuous stepwise surface portion of the semiconductor device. This increases the manufacturing cost.

Figure 2A:
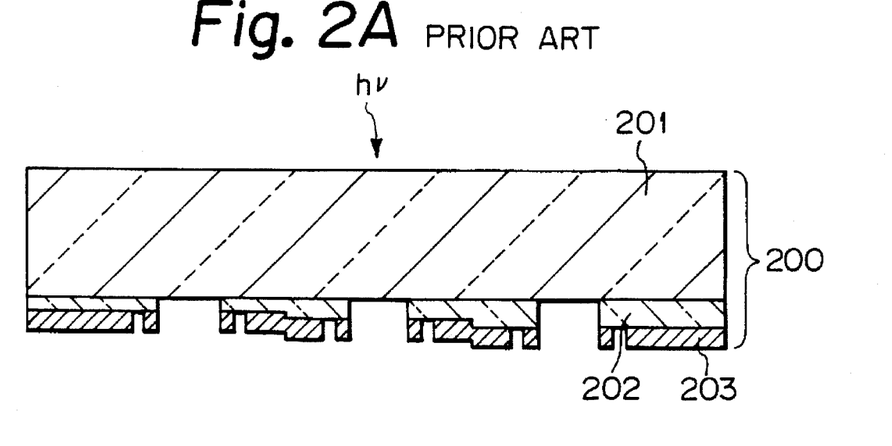
FIG. 2A is a cross-sectional view illustrating a photomask (or reticle) for explaining a second prior art method for manufacturing a semiconductor device.
Figure 2B:
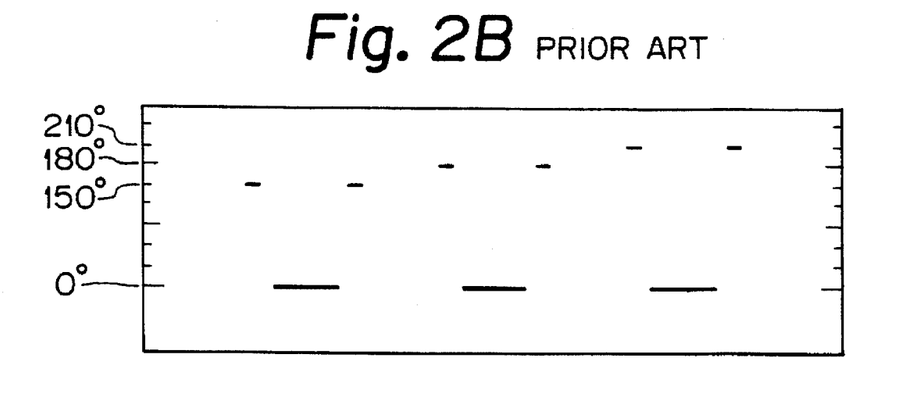
FIG. 2B is a graph showing the phase shift amount of the phase shift layer of FIG. 2A.

In FIG. 2A, which shows a second prior art, manufacturing method, a photomask (or reticle) 200 is formed using a glass substrate 201, a phase shift layer 202 formed on the glass substrate 201, and an optical shield layer 203 formed on the phase shift layer 202 (sec JP-A-HEI1-147458). In this case, the thickness of the phase shift layer 202 is changed to obtain a phase shift amount as shown in FIG. 2B; however, the refractive index of the phase shift layer 202 can be changed to obtain the same phase shift amount. The phase shift amount as shown in FIG. 2B corresponds to a distribution of height of a semiconductor substrate 204 as illustrated in FIG. 2C.

Figure 2C:
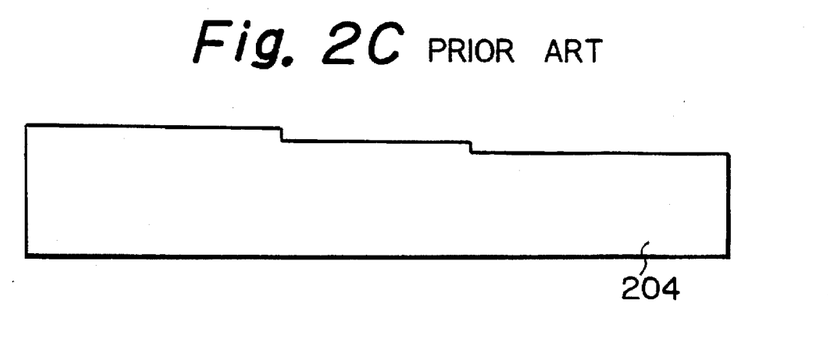
FIG. 2C is a cross-sectional view illustrating a semiconductor substrate irradiated by light through the photomask (or reticle) of FIG. 2A.

In the manufacturing method as shown in FIGS. 2A, 2B and 2C, however, as stated above, the thickness or refractive index of the phase shift layer 202 has to be changed in accordance with the level of the stepwise semiconductor substrate 204, which increases the manufacturing cost. Also, the selection of material for the phase shift layer 202 is difficult.

Figure 3:
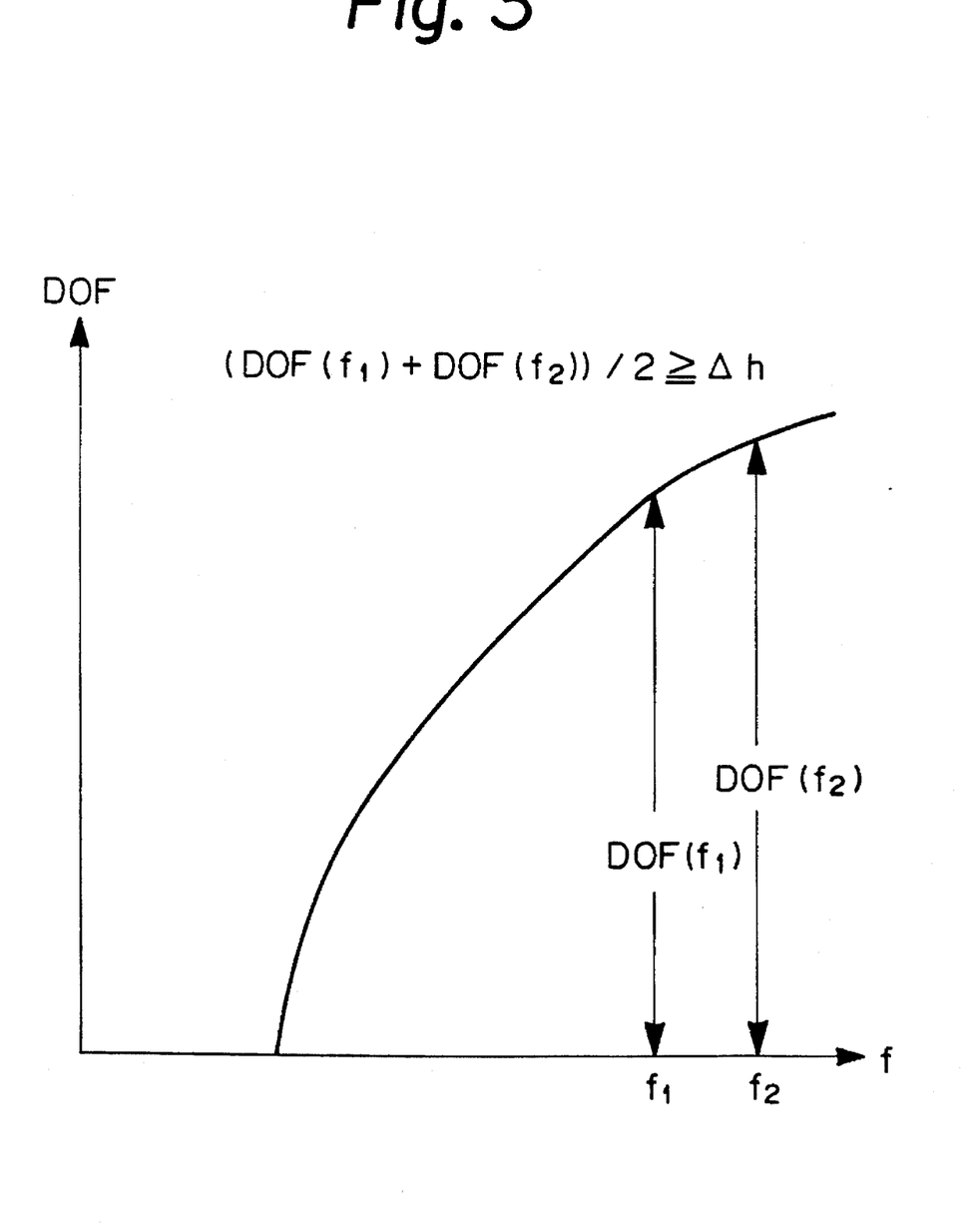
FIG. 3 is a graph showing a relationship between a minimum feature size and a depth of focus.

In FIG. 3, which shows a relationship between a minimum feature size f and a depth of focus DOF according to the present invention, if a layer including a first portion having a first height $h_1$ and a second portion having a second height $h_2$ different from the First height $h_1$, minimum feature size $f_1$ and $f_2$ are allocated to the first and second portions. In this case, the following condition is satisfied:

$$(DOF(f_1)+DOF(f_2))/2 \div |h_1-h_2|$$

Also, if the layer includes a third portion having a third height $h_3$ between the first height $h_1$ and the second height $h_2$, the minimum feature size $f_1$ or $f_2$ is allocated to the third portion. For example, if the third height $h_3$ is closer to the first height $h_1$ than the second height $h_2$, the minimum feature size $f_1$ is allocated to the third portion. Contrary to this, if the third height $h_3$ is closer to the second height, $h_2$ than the first height $h_1$, the minimum feature size $f_2$ is allocated to the third portion.

Figure 4A:
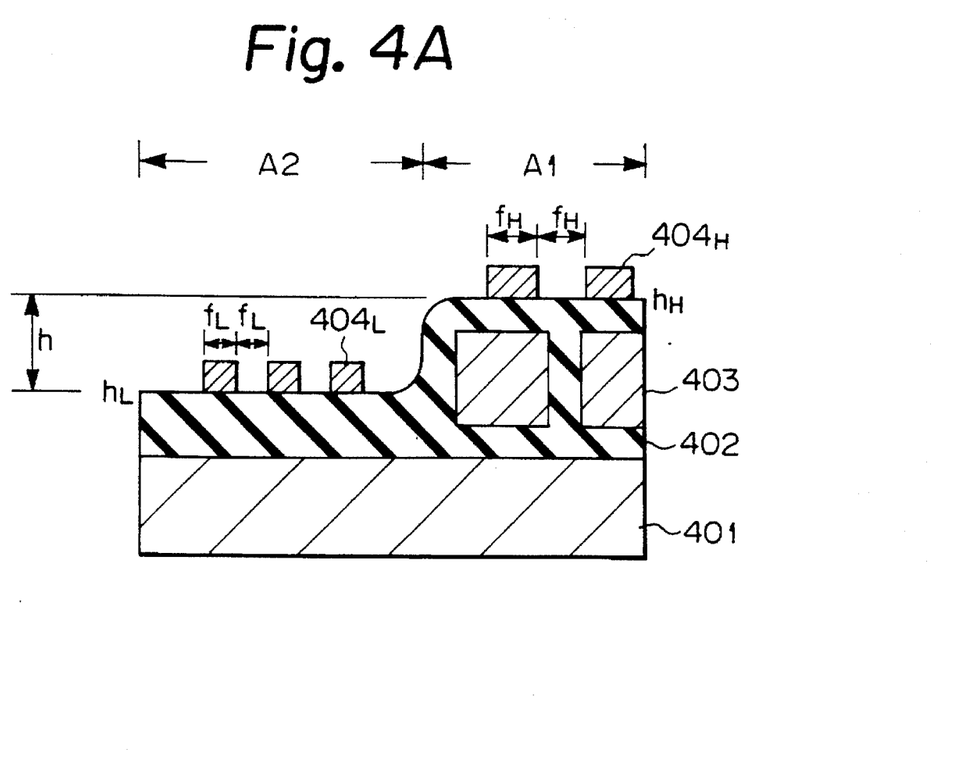
FIGS. 4A and 4B are cross-sectional views illustrating a first embodiment of the method for manufacturing a semiconductor device according to the present invention.

In FIG. 4A, which illustrates a first embodiment of the present invention, reference numeral 401 designates a semiconductor substrate on which an insulating layer 402 is formed. In this case, the semiconductor substrate 401 is divided into an area A1 and an area A2, and a metal layer 403 is located only in the area A1. Therefore, the height $h_H$ of the insulating layer 402 in the area A1 is higher than the height $h_L$ of the insulating layer 402 in the area A2. As a result, a minimum feature size $f_H$ of a metal layer $404_H$ formed on the area A1 of the insulating layer 403 is made larger than a minimum feature size $f_L$ of a metal layer $404_L$ formed on the area A2 of the insulating layer 403. In this case, $$(DOF(f_H)+DOF(f_L))/2 \geq h_H-h_L \qquad (1)$$

Note that the metal layers $404_H$ and $404_L$ are made of the same material by using a photolithography technology or an electron beam technology. For example, $f_H=1.0$ μm and $f_L=0.6$ μm.

Figure 4B:
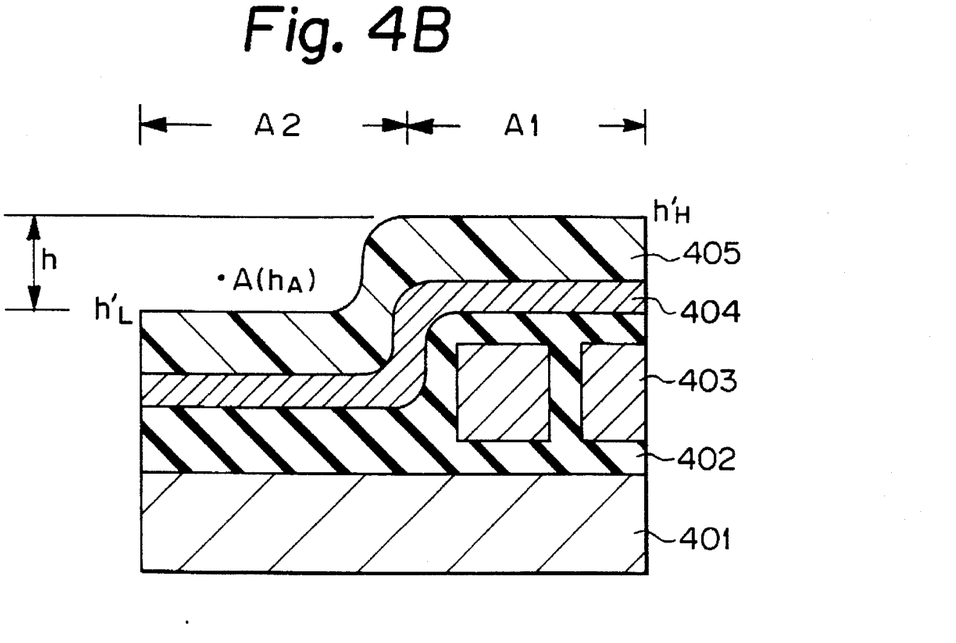

In FIG. 4B, which shows the semiconductor device of FIG. 4A before the formation of the metal layers $404_H$ and $404_L$, a photoresist layer 405 is coated on a metal layer 404. In this case, the height $h_H'$ of the photoresist layer 405 in the area A1 is higher than the height $h_L'$ of the photoresist layer 405 in the area A2, and the following is satisfied:

$$\Delta h = h_H - h_L \qquad (2)$$
$$= h_H' - h_L'$$

Also, the height $h_A$ of a center A of an image formed by an image formation beam such as an optical beam is between the height $h_H'$ and the height $hg_L'$. In this case, in order to form an image having the miniature feature size $f_H$ in the area A1, the following has to be satisfied:

$$(DOF(f_H))/2 \geq h_H'-h_A \qquad (3)$$

Similarly, in order to form an image having the minimum feature size $f_L$ in the area A2, the following has to be satisfied:

$$(DOF(f_L))/2 \geq h_A-h_L' \qquad (4)$$

Therefore, from the formulae (2), (3) and (4), $$(DOF(f_H) + DOF(f_L))/2 \geq h_H' - h_L' = h_H - h_L = \Delta h \qquad (5)$$

Further, the height $h_A$ of the center A is preferably approximately $$\Delta h \cdot DOF(f_L)/((DOF(f_H)+DOF(f_L))) \qquad (6)$$

Thus, in FIGS. 4A and 4B, the metal layer $404_L$ can be fine-structured to enhance the integration of the device. In other words, if the metal layer $404_H$ in the area A1 is required to be not so fine-structured, and the metal layer $404_L$ in the area A2 is required to be fine-structured, the metal layer $404_L$ can be fine-structured to enhance the integration of the device.

Figure 5A:
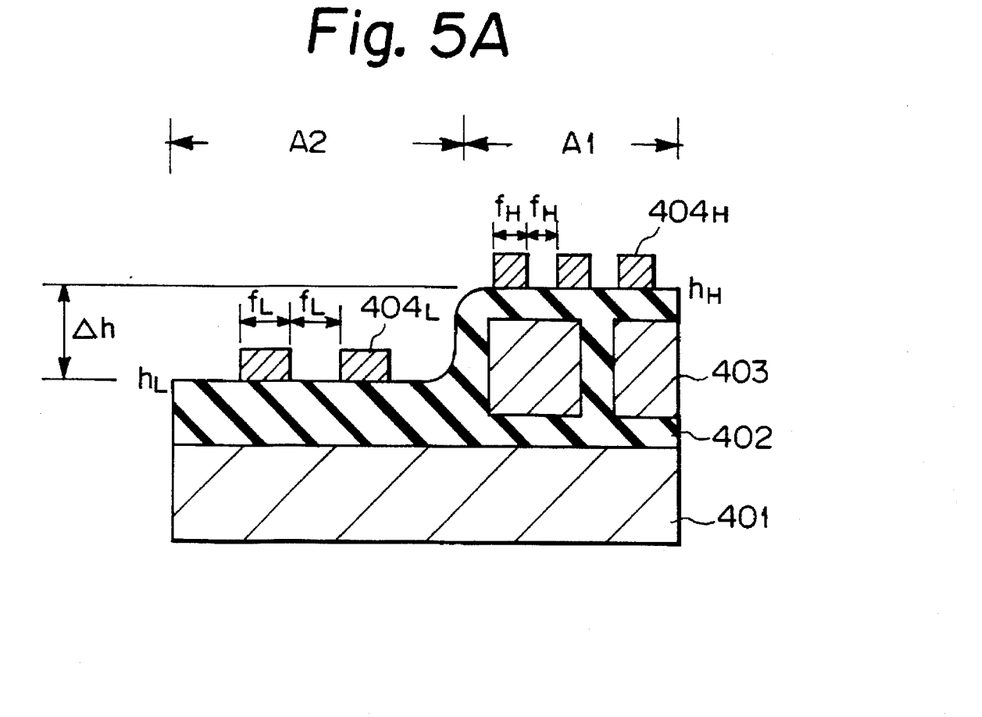
FIGS. 5A and 5B are cross-sectional views illustrating a second embodiment of the method for manufacturing a semiconductor device according to the present invention.

In FIG. 5A, which illustrates a second embodiment of the present invention, the minimum feature size $f_H$ of the metal layer $404_H$ formed on the area A1 of the insulating layer 403 is made smaller than the minimum feature size $f_L$ of the metal layer $404_L$ formed on the area A2 of the insulating layer 403. For example, $f_H=0.6$ μm and $f_L=1.0$ μm. Also, in this case, $$(DOF(f_H)+DOF(f_L))/2 \geq h_H-h_L \qquad (1)'$$

Figure 5B:
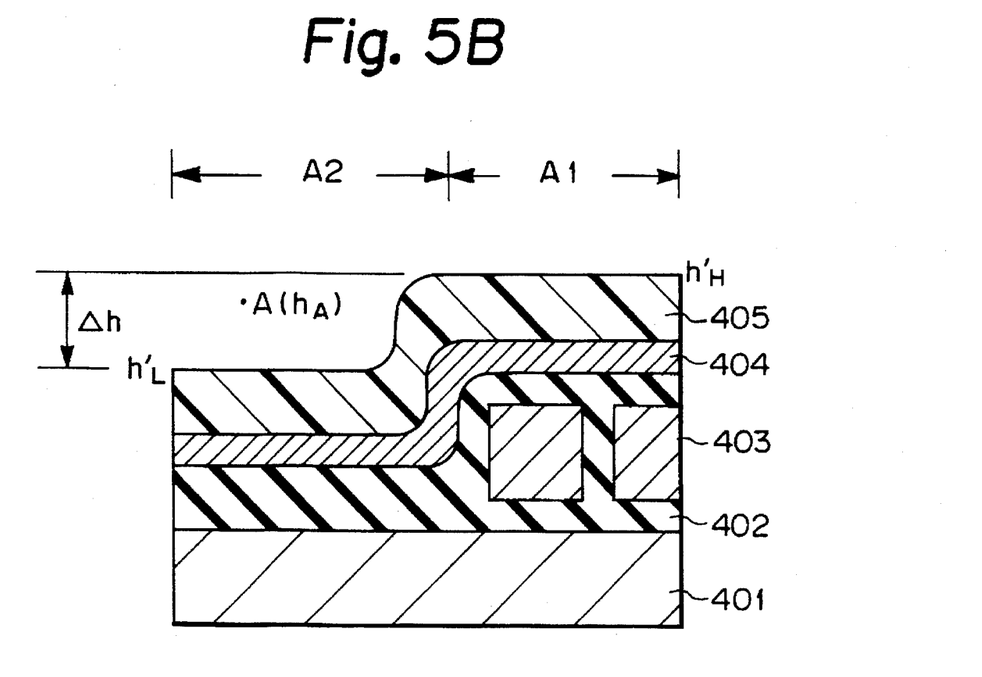

In FIG. 5B, which shows the semiconductor device of FIG. 5A before the formation of the metal layers $404_H$ and $404_L$, the photoresist layer 405 is coated on metal layer 404. Also, in this case, the following is satisfied:

$$\Delta h = h_H - h_L \qquad (2)'$$
$$= h_H' - h_L'$$

Further, the height $h_A$ of a focus A of an image formed by an image formation beam such as an optical beam is between the height $h_H'$ and the height $h_L'$. Also, in this case, in order to form an image having the minimum feature size $f_H$ in the area A1, the following has to be satisfied:

$$(DOF(f_H))/2 \geq h_H' - h_A \qquad (3)'$$

Similarly, in order to form an image having the minimum feature size $f_L$ in the area A2, the following has to be satisfied:

$$(DOF(f_L))/2 \geq h_A - h_L \qquad (4)'$$

Therefore, from the formulae (2)', (3)' and (4)', $$(DOF(f_H) + DOF(f_L))/2 \geq h_H' - h_L' = h_H - h_L = \Delta h \qquad (5)'$$

Further, the height $h_A$ of the focus A is preferably approximately $$\Delta h \cdot DOF(f_L)/((DOF(f_H) + DOF(f_L))) \qquad (6)'$$

Thus, in FIGS. 5A and 5B, the metal layer $404_H$ can be fine-structured to enhance the integration of the device. In other words, if the metal layer $404_H$ in the area A1 is required to be fine-structured, and the metal layer $404_L$ in the area A2 is required to be not so fine-structured, the metal layer 404, can be fine-structured to enhance the integration of the device.

Figure 6A:
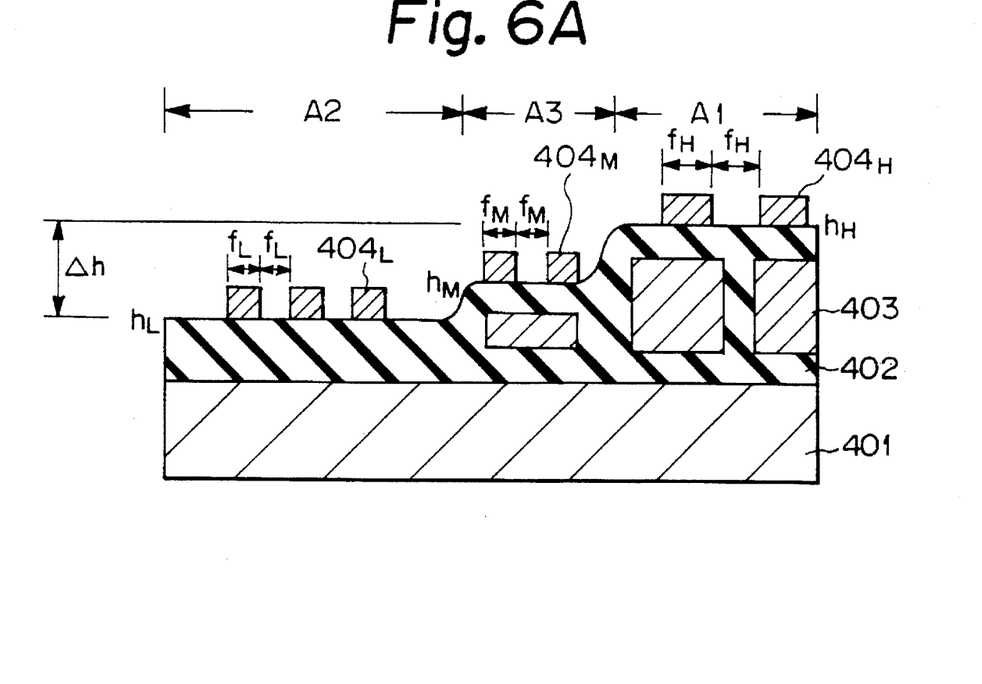
FIGS. 6A and 6B are cross-sectional views illustrating a third embodiment of the method for manufacturing a semiconductor device according to the present invention.

In FIG. 6A, which illustrates a third embodiment of the present invention, an area A3 is added to FIG. 4A. In the area A3, the height $h_M$ of the insulating layer 402 is between the height $h_H$ and the height $h_L$. In this case, a minimum feature size $f_M$ of a metal layer $404_M$ formed simultaneously with the formation of the metal layers $404_H$ and $404_L$ is the same as $f_H$ or $f_L$. For example, if $h_M$ is closer to $h_L$ than $h_H$, $f_M = f_L$ as illustrated in FIG. 6A. Conversely, if $h_M$ is closer to $h_H$ than $h_L$, $f_M = f_H$.

Figure 6B:
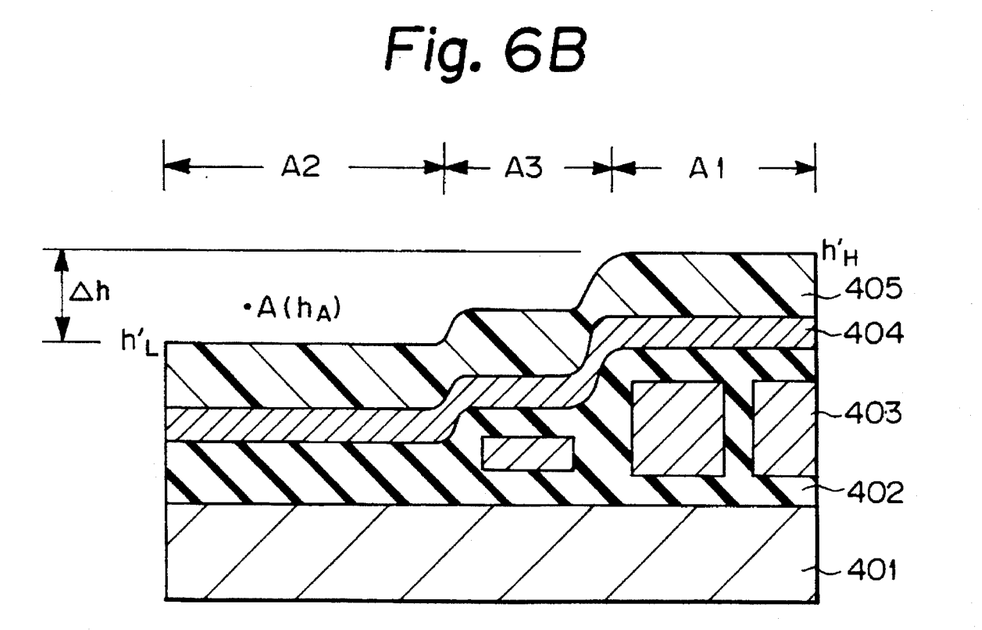

In FIG. 6B, which shows the semiconductor device of FIG. 6A before the formation of the metal layers $404_H$, $404_L$ and $404_M$, the conditions as in the formulae (1) to (6) are satisfied in the device of FIG. 4B.

Thus, even in FIGS. 6A and 6B, the metal layer $404_L$ and $404_M$ can be fine-structured to enhance the integration of the device.

Note that, if the same minimum feature size is used for all of the areas, this minimum size may be a value larger than an average value of the minimum feature sizes $f_L$ and $f_H$ in FIGS. 4A, 5B or 6A, or a larger one of the minimum feature sizes $f_L$ and $f_H$ in FIG. 4A, 5B or 6A. Therefore, the enhancement of integration of the device cannot be expected.

Figure 7:
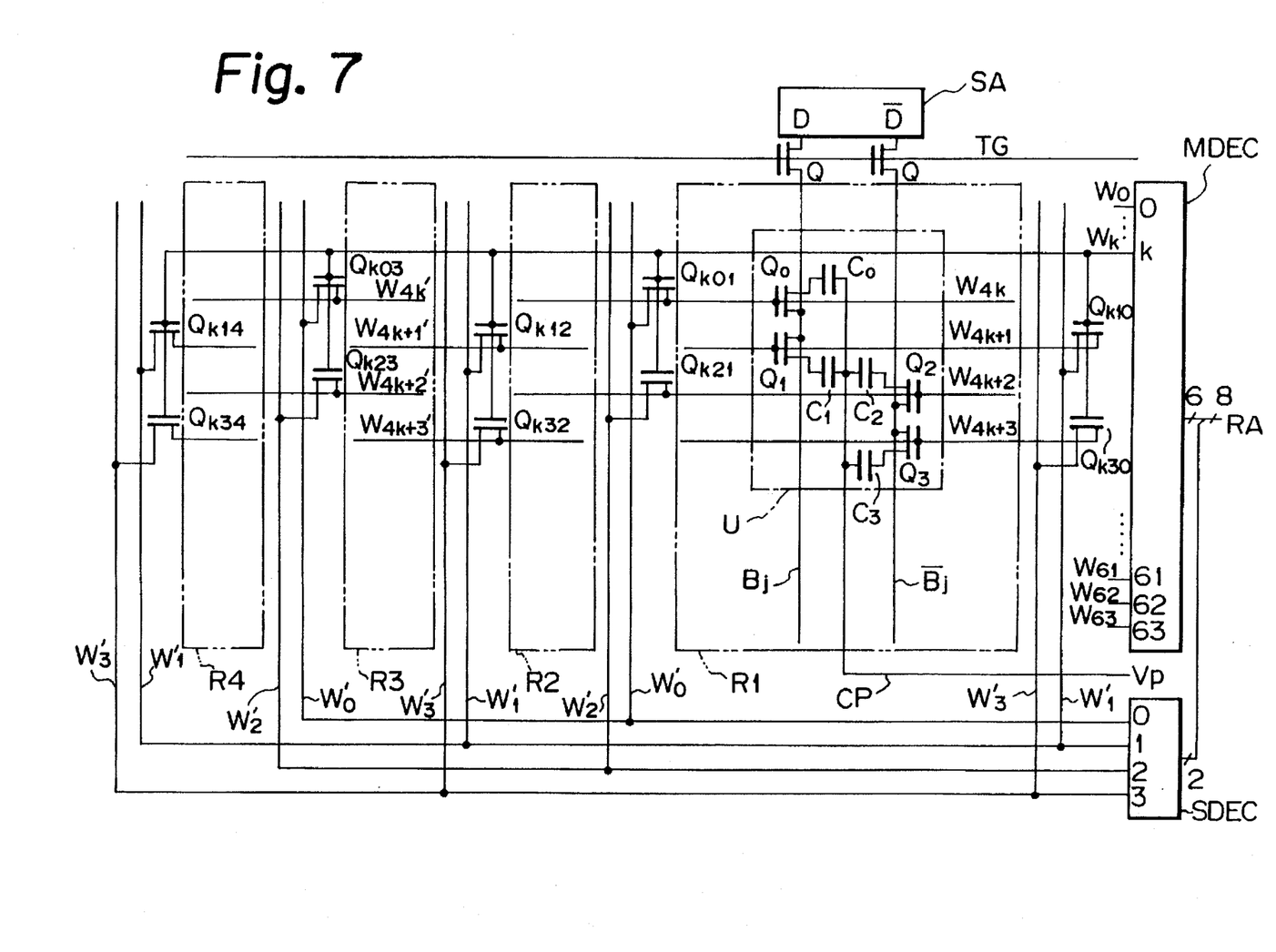
FIG. 7 is a circuit diagram illustrating a DRAM device to which the manufacturing method according to the present invention is applied.

In FIG. 7, which illustrates a 256 kbit DRAM which the manufacturing method according to the present invention is applied, one memory cell of a one-transistor type is provided at each intersection between 256 word lines and 1024 bit line pairs.

In FIG. 7, six bits of an 8-bit row address signal RA are supplied to a main X decoder MDEC and the other two bits are supplied to a sub X decoder SDEC. The main X decoder MDEC selects one of 64 main word lines $W_0$ to $W_{63}$, and the sub X decoder SDEC selects one of four sub word lines $W_0'$ to $W_3'$.

The 256 kbit memory cells are divided into four memory arrays R1, R2, R3 and R4 each including 64 kbit memory cells. Arranged between the memory cell arrays R1, R2, R3 and R4 are the pair of sub word lines $W_0'$ and $W_2'$ and the pair of sub word lines $W_1'$ and $W_3'$.

The sub word lines $W_0'$, $W_1'$, $W_2'$ and $W_3'$ are connected via selection transistors $Q_{kjl}$ (k=0 to 63, j=0 to 3, l=0 to 4) to word lines $W_{4k}$, $W_{4k+1}$, $W_{4k+2}$, $W_{4k+3}$, $W_{4k}'$, $W_{4k+1}'$, $W_{4k+2}'$ and $W_{4k+3}'$ within the memory cell arrays R1, R2, R3 and R4. The selection transistors $Q_{kjl}$ are controlled by the voltage at the main word line $W_k$. Also the word line $W_{4k}$ and $W_{4k+2}$ are arranged within the memory cell arrays R1 and R2, and the word line $W_{4k}'$ and $W_{4k+2}'$ are arranged within the memory cell arrays R3 and R4. Further, the word line $W_{4k+1}$ and $W_{4k+3}$ are arranged within the memory cell arrays R1 and R4, and the word line $W_{4k+1}'$ and $W_{4k+3}'$ are arranged within the memory cell arrays R2 and R3. Thus, only one of the word lines $W_{4k}$, $W_{4k+1}$, $W_{4k+2}$, $W_{4k+3}$, $W_{4k}'$, $W_{4k+1}'$, $W_{4k+2}'$ and $W_{4k+3}'$ (k=0 to 63) is selected in accordance with the row address signal RA.

Each of the memory cell arrays R1, R2, R3 and R4 is constructed by 16384 four-bit unit cells U. The four-bit unit cell U includes four cell transistors $Q_0$ to $Q_3$ and four capacitors $C_0$ to $C_3$. Each of the cell transistors $Q_0$ to $Q_3$ has a gate connected to one of the word lines $W_{4k}$ to $W_{4k+3}$, respectively, a source connected to bit lines $B_j$ or $\overline{B_j}$, and a drain connected to an electrode of one of the capacitors $C_0$ to $C_3$, respectively. Also, other electrodes of the capacitors $C_0$ to $C_3$ are connected commonly to a cell plate CP.

During the read mode, selected information is transmitted via the bit lines $BL_j$ and $\overline{BL_j}$ and gating transistors $Q_j$ and $\overline{Q_j}$ to 1024 sense amplifiers SA. In this case, the gating transistors $Q_j$ and $\overline{Q_j}$ are controlled by the voltage at a timing gate line TG. During the write mode, information stored in the sense amplifiers SA is transmitted via the gating transistors $Q_j$ and $\overline{Q_j}$ and the bit lines $BL_j$ and $\overline{BL_j}$ to the memory cells, and is written into one of the memory cells selected by the word lines $W_{4k}$ to $W_{4k+3}$.

The DRAM device of FIG. 7 can be manufactured by a complementary metal oxide semiconductor (CMOS) technology using a 0.4 μm design rule and an i-line high NA stepper.

The manufacturing steps of the DRAM device of FIG. 7 are explained next with reference to FIGS. 8A, 9A 9B, 10A, 11A, 12A, 13A and 14A, and FIGS. 8B, 9B, 10B, 11B, 12B, 13B and 14B which are cross-sectional views taken along the lines X—X and Y—Y of FIGS. 8A, 9A, 10A, 11A, 12A, 13A and 14A, respectively. Note that the lines X—X and Y—Y are shown only in FIG. 8A, and are omitted from FIGS. 9A, 10A, 11A, 12A, 13A and 14A.

Figure 8A:
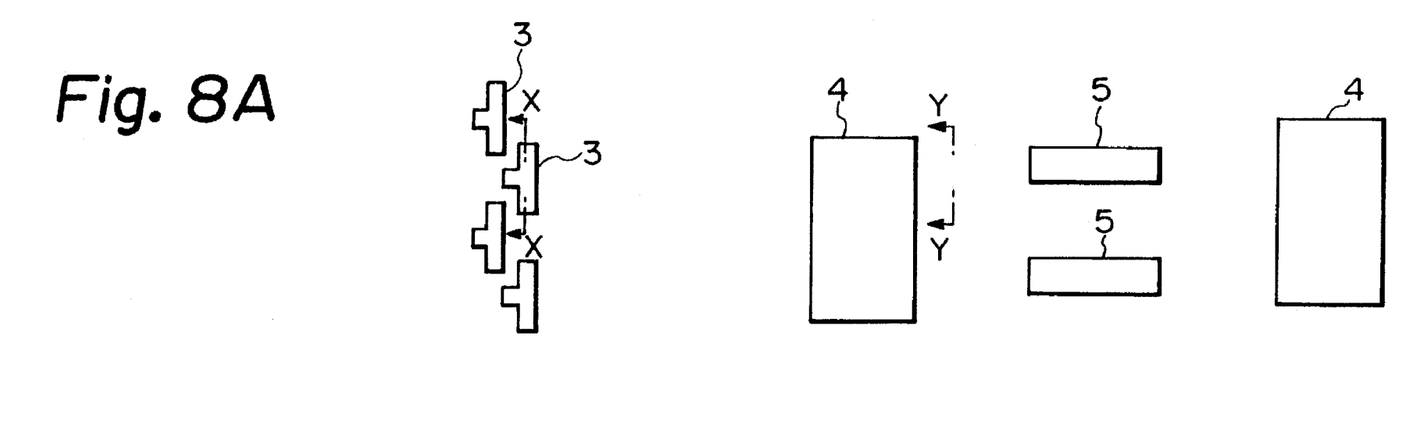
FIGS. 8A, 9A, 10A, 11A, 12A, 13A and 14A are plan views for explaining a method for manufacturing the DRAM device of FIG. 7.
Figure 8B:
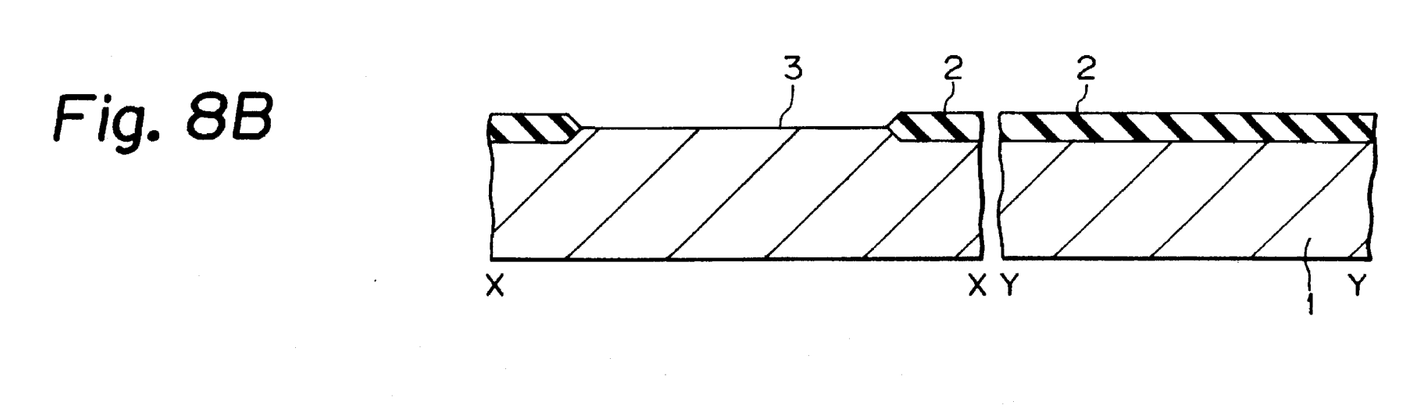
FIGS. 8B, 9B, 10B, 11B, 12B, 13B and 14B are partial cross-sectional views of the device of FIGS. 8A, 9A, 10A, 11A, 12A, 13A and 14A, respectively.

Referring to FIGS. 8A and 8B, a P-Type monocrystalline silicon substrate 1 is thermally oxidized by using a local oxidation of silicon (LOCOS) method, to thereby form an about 0.3 μm thick field oxide layer 2. The field oxide layer 2 partitions an active area 3 for a memory cell, an active area 4 for a selection transistor such as $Q_{k01}$, and an active area 5 for a terminal.

Figure 9A:
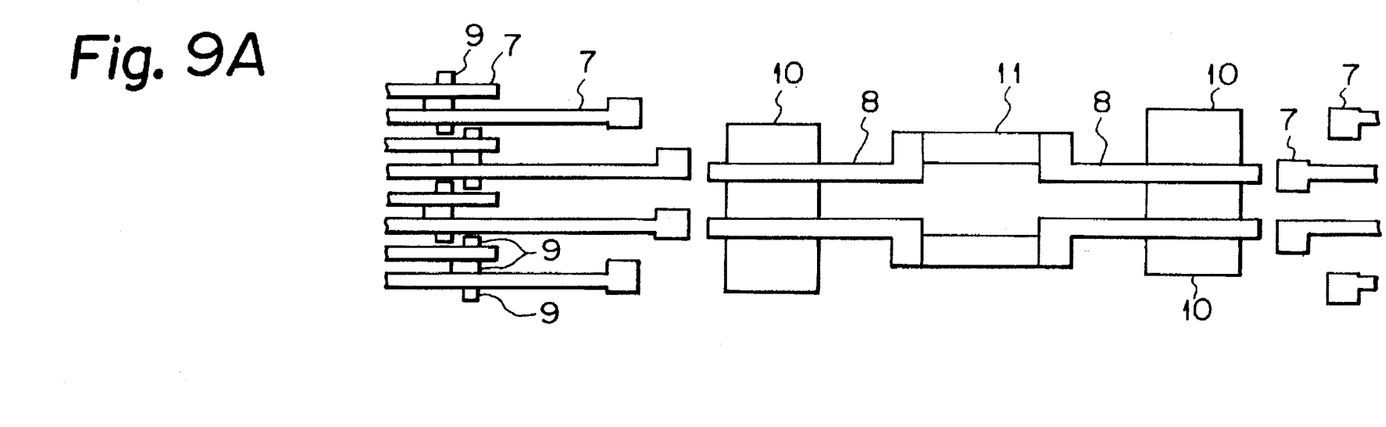
Figure 9B:
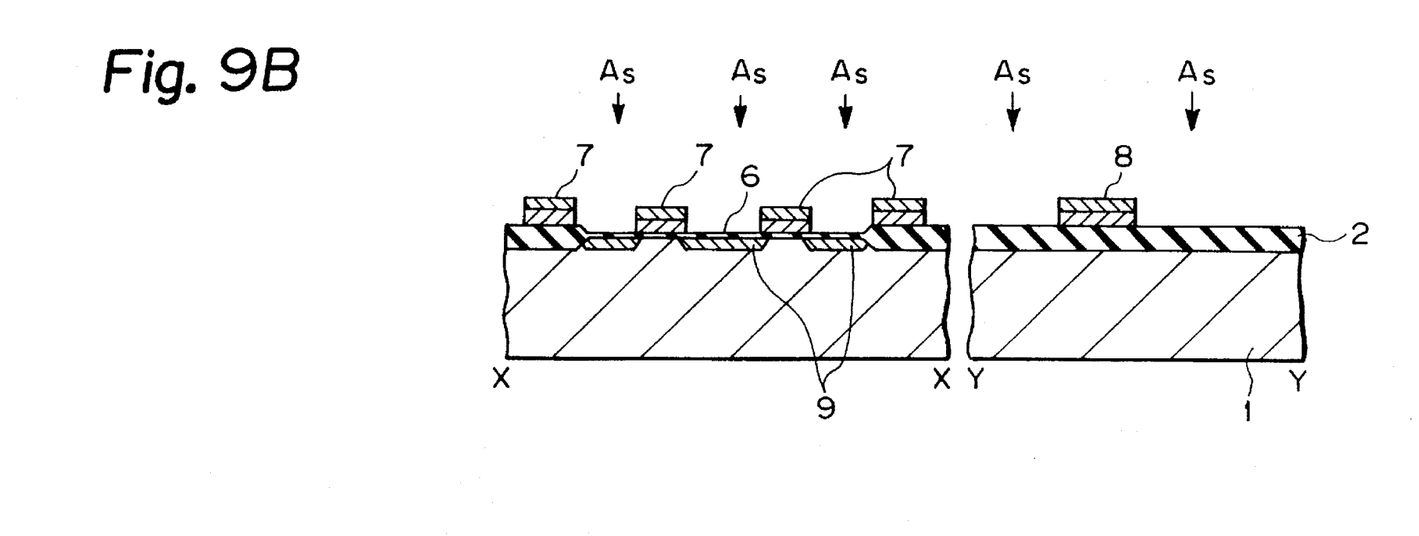

Referring to FIGS. 9A and 9B, a gate oxide layer 6 is formed, and a polycide layer about 2500 Å thick is deposited thereon. This polycide layer is patterned to form word lines 7 corresponding to the word lines $W_{k^4}$ $W_{k^{4+3}}$ and $W_{k^4}'$ to $W_{k^{4+3}}'$ and gate electrodes 8 of the selection transistors. Next, arsenic ions are implanted while masking the word lines 7 and the gate electrodes 8, to form N-type impurity regions 9 for the cell transistors, N-type impurity regions 10 for the selection transistors, and N-type impurity regions 11 for the terminal within the substrate 1. Here, the width and minimum pitch of the word lines 7 are both about 0.7 μm.

Figure 10A:
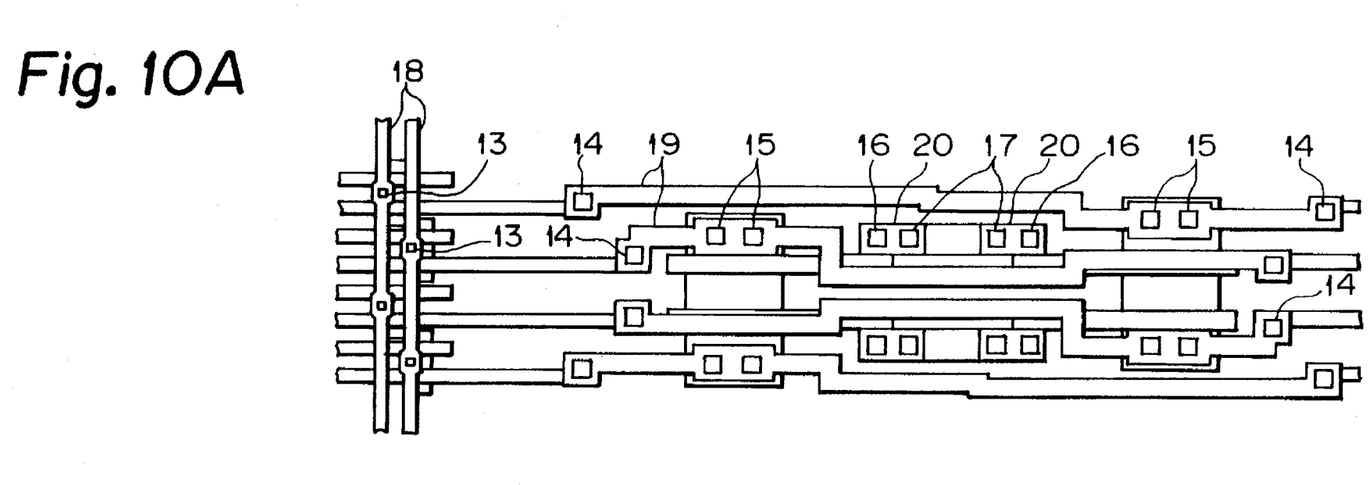
Figure 10B:
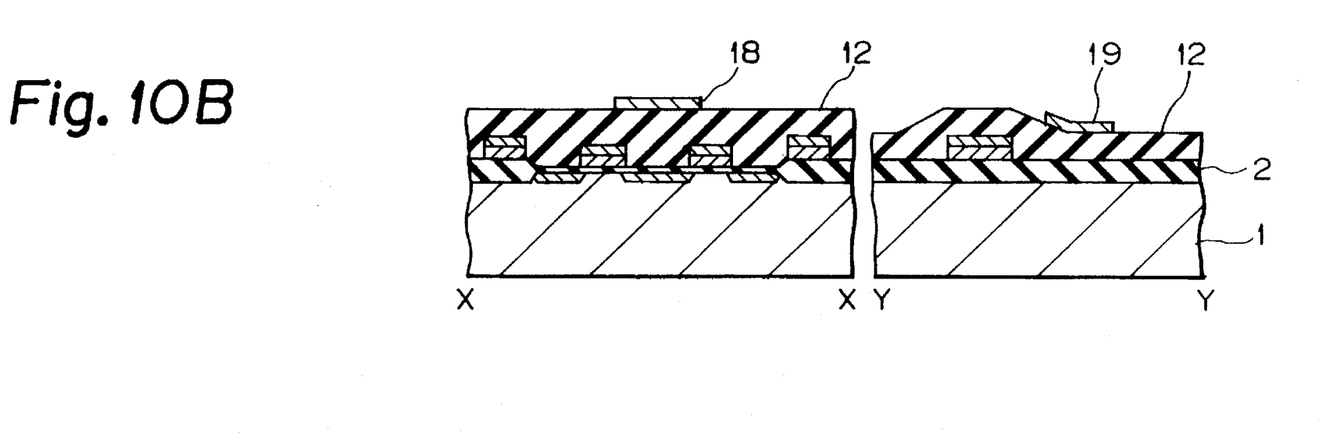

Next, referring go FIGS. 10A and 10B, an insulating layer 12 is deposited. Then, about 0.2 μm square contact holes 13 for the sources of the cell transistors, contact holes 14 for the word lines, contact holes 15 for the sources or drains of selection transistors, contact holes 16 for the gate electrodes of the selection transistors, and contact holes 17 for the N-type impurity regions 11 are perforated. Next, a silicide layer about 1000 Å thick is formed by using a sputtering process. Then, the silicide layer 18 is patterned to form bit lines 18 corresponding to the bit lines $BL_j$ and $\overline{BL_j}$, connections 19 between the word lines 7 and the N-type impurity regions 10 of the selection transistors, and connections 20 between the gate electrodes 8 and the N-type impurity regions 11 for the terminals. Here, the width and minimum pitch lines are both about 0.4 μM, and the minimum pitch of the connections 19 and 20 is about 0.4 μm.

Figure 11A:
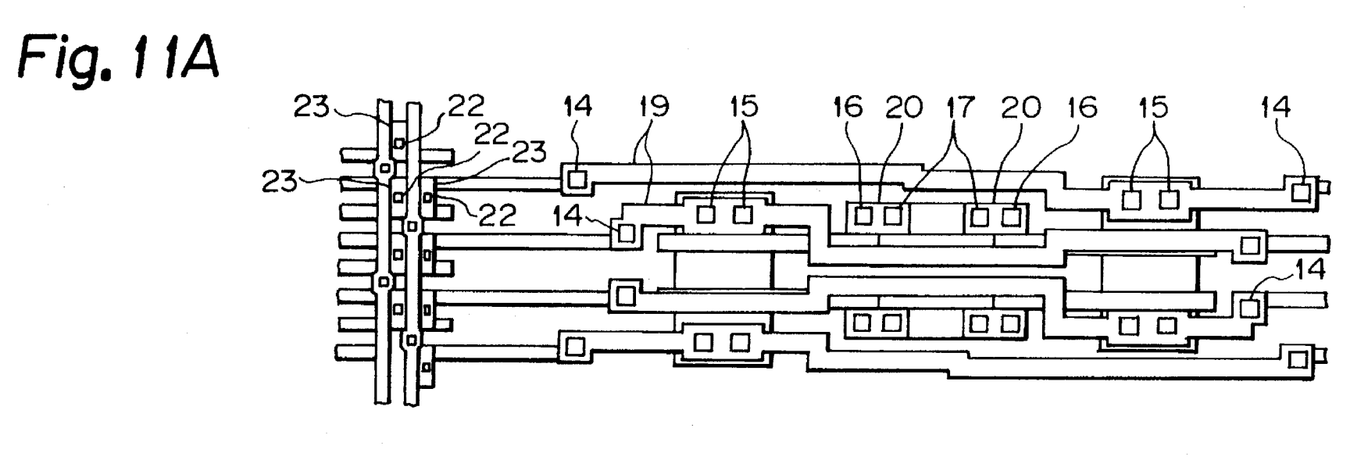
Figure 11B:
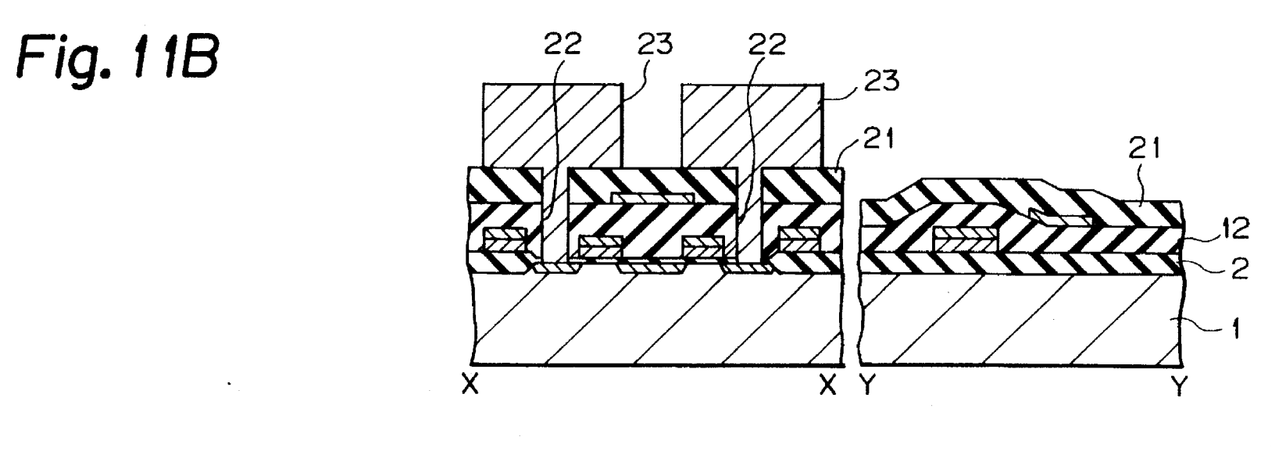

Next, referring to FIGS. 11A and 11B, an insulating layer 21 is formed. Then, about 0.2 μm square contact holes 22 are perforated. After that, a polycrystalline silicon layer about 8500 Å thick is deposited, and phosphorus is doped thereinto. Then, the polycrystalline silicon layer is patterned to form capacitor electrodes 23 for stacked capacitors.

Figure 12A:
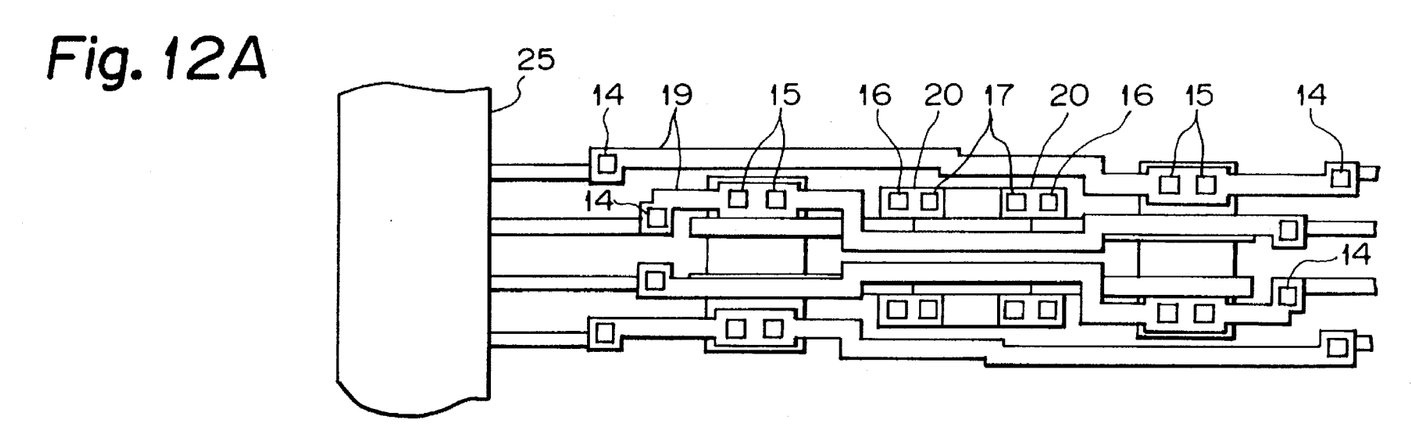
Figure 12B:
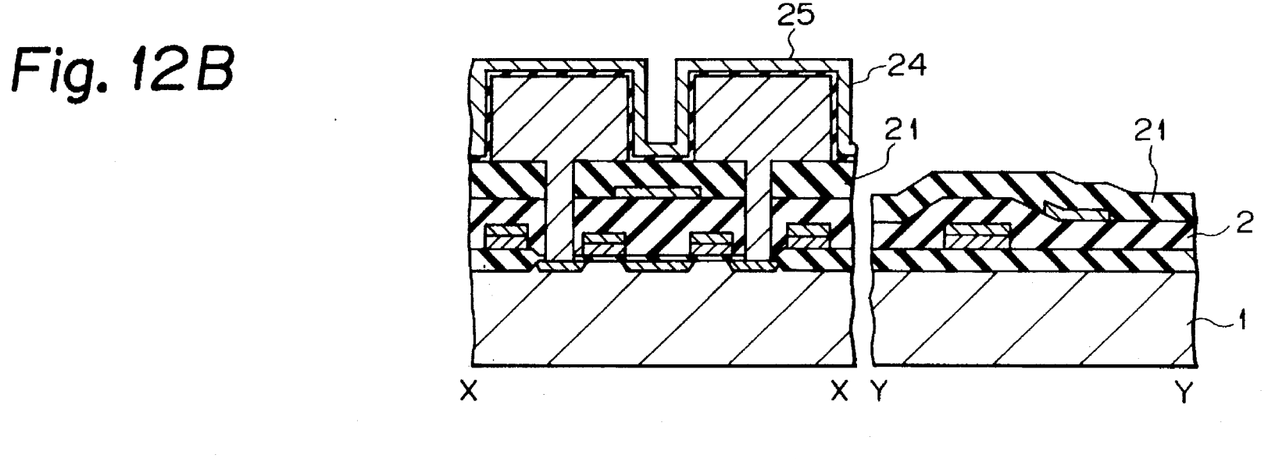

Next, referring to FIGS. 12A and 12B, a capacitor insulating layer 24 made of silicon oxide and silicon nitride is formed on the capacitor electrode 23. Then, a polycrystalline silicon layer about 1500 Å thick is deposited and is patterned to form a cell plate 25 corresponding to the cell plate CP covering the entire memory cell portion. Thus, stacked capacitors each having a capacity of about 20 fF can be obtained.

Figure 13A:
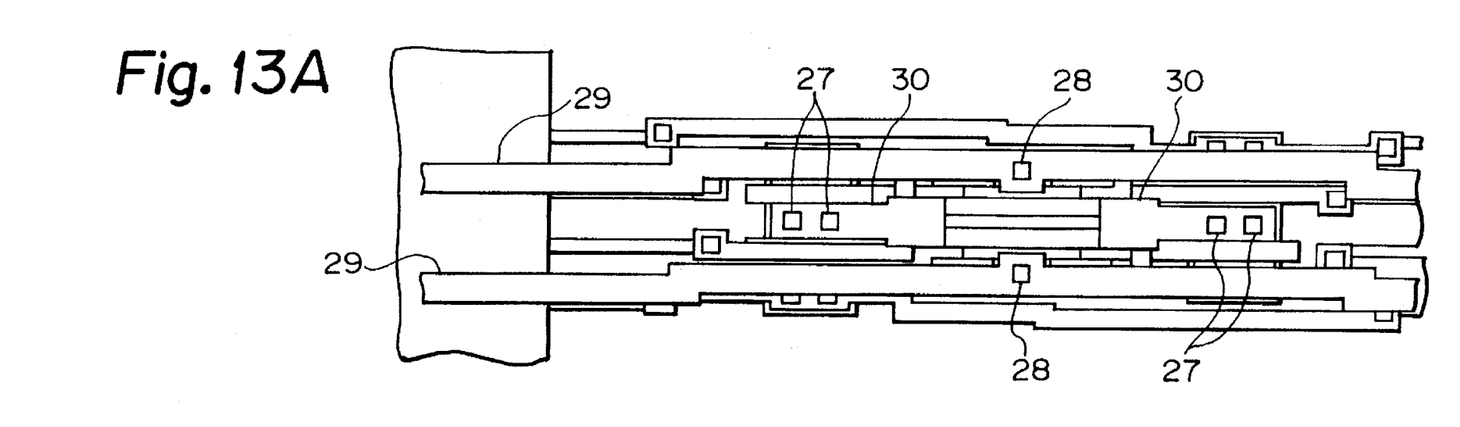
Figure 13B:
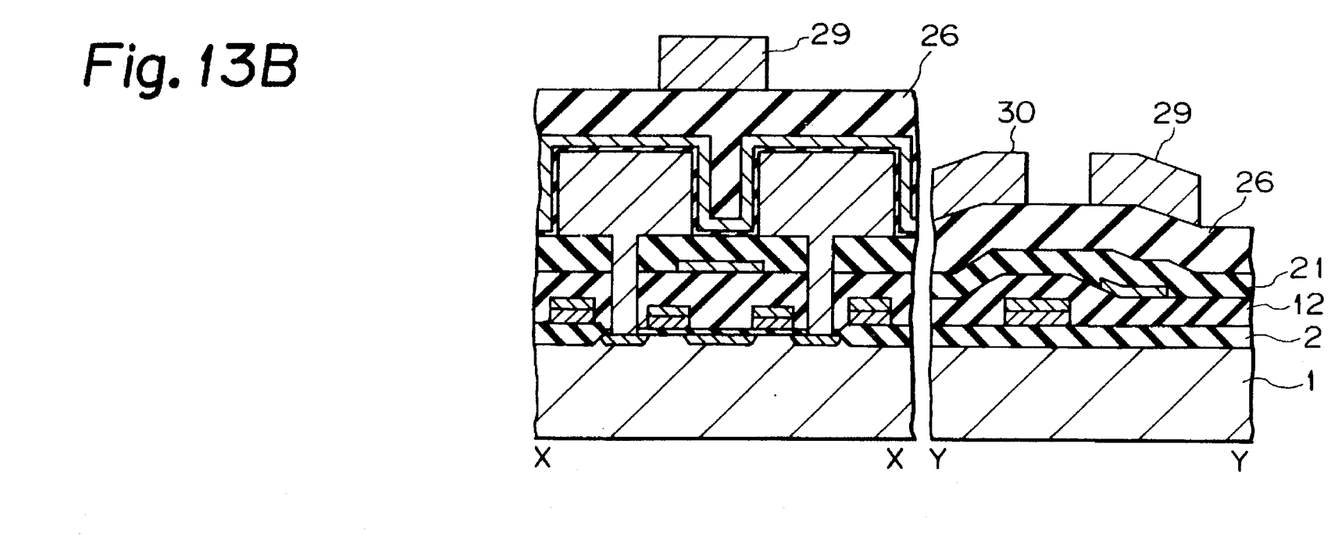

Next, referring to FIGS. 13A and 13B, an insulating layer 26 is formed. Then, contact holes 27 for the N-type impurity regions of the selection transistors and contact holes 28 for the N-type impurity regions of the terminals are perforated. Next, an aluminum alloy layer about 1500 Å thick is deposited and patterned, to thereby form main word lines 29 corresponding to the main word lines $W_k$ and internal connections 30 connected to the N-type impurity regions of the selection transistors.

For the main word lines 29 and the internal connections 30, the minimum feature size in the memory cell array portions is 1.0 μm, and the minimum feature size in the peripheral portions is 0.6 μm, in view of the difference 1.1 μm in height therebetween. As a result, the internal connections 30 can be arranged among the main word lines 29. Also, although it is not shown, the minimum feature size 0.6 μm is adopted in a sense amplifier portion, thus arranging fine aluminum alloy connections therein.

Figure 14A:
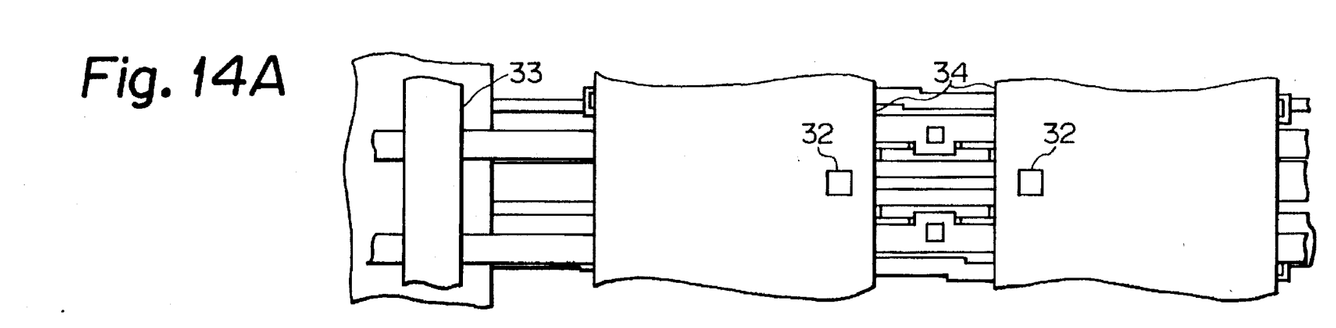
Figure 14B:
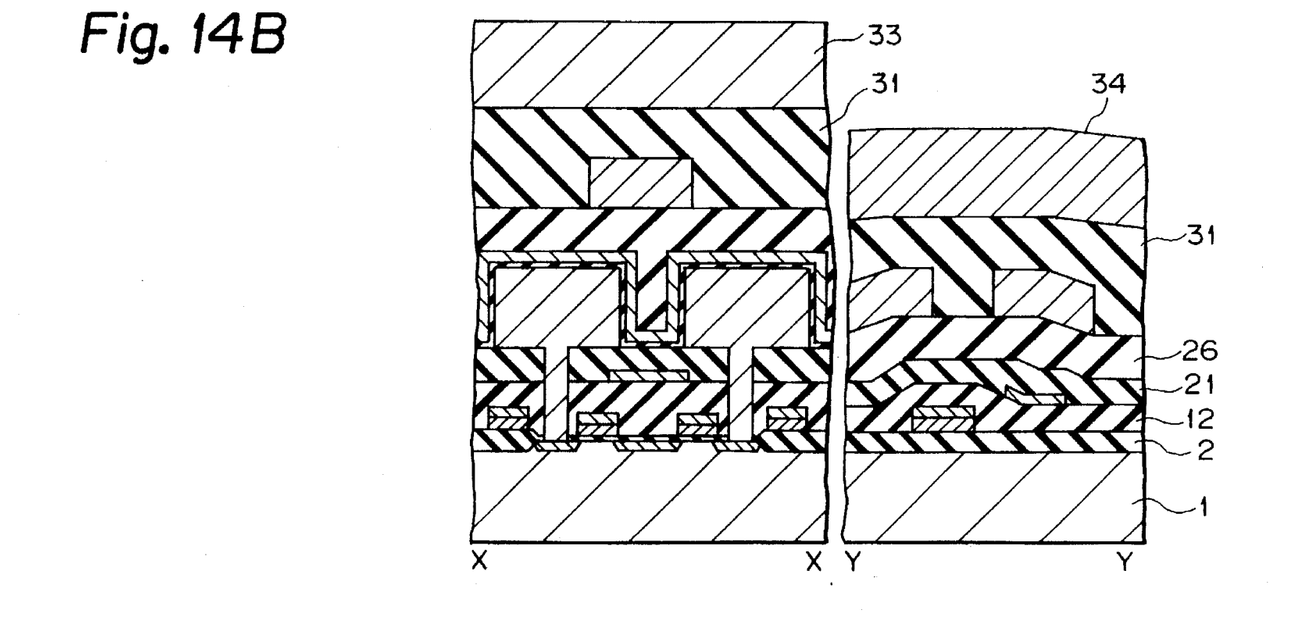

Finally, referring to FIGS. 14A and 14B, an insulating layer 31 is formed. Then, throughholes 32 are perforated in the insulating layer 31, to expose the internal connections 30. Next, aluminum alloy layer about 5000 Å thick is deposited and patterned, to form a power supply line 33 and sub word lines 34 corresponding to the sub word lines $W_0'$ to $W_3'$. The sub word lines 34 are connected via the internal connections 30 to the N-type impurity regions of the selection transistors, thus completing the DRAM device.

When exposing a 1.7 μm thick photoresist layer by using an i-line stepper of NA=0.5, the depth of focus (DOF) for the minimum feature size f=0.6 μm is 1.0 μm, and the depth of focus (DOF) for the minimum feature size f=1.0 μm is 2.0 μm. When the difference in height of the photoresist layer is 1.1 μm, if the same minimum feature size 0.6 μm is adopted, it is impossible to form an image on all the positions of the photoresist layer. Contrary to this, in the above-described embodiment, if the minimum feature size on a high position of the photoresist layer is 1.0 μm and the minimum feature size on a low position of the photoresist layer is 0.6 μm, it is possible to form an image at all of the positions of the photoresist layer, since the following is satisfied:

$$(DOF\ (1.0\ \mu m) + DOF\ (0.6\ \mu m))/2 = 0.5 + 1.0 = 1.5 > 1.1$$

In this case, the focus of an image is located at a position between the high and low positions.

Also, in the above-mentioned embodiment, there is a step of about 0.3 μm in the silicide layers 7 and 8. Therefore, in this case, two kinds of minimum feature sizes such as 0.35 μm and 0.45 μm can be adopted for the high and low positions, respectively, of the silicide layers, thus enhancing the integration.

Further, the present invention can be applied to the memory cell portion and peripheral portion of a static RAM device, a read-only memory (ROM) device, an erasable and programmable ROM (EPROM), and the like.

As explained hereinbefore, according to the present invention, since two or more different minimum feature sizes are adopted in forming stepwise pattern layers, the integration of the device can be enhanced without reducing the manufacturing yield and increasing the manufacturing cost.

I claim:

1. A method for manufacturing a semiconductor device comprising the steps of:

forming a layer on a semiconductor substrate, said layer including a first portion having a first height and a second portion having a second height different from the first height;

irradiating an image formation beam onto said layer, to form a first pattern on said first portion and a second pattern on said second portion, a minimum feature size of said first pattern being different from a minimum feature size of said second pattern.

2. A method as set forth in claim 1, wherein the minimum feature size of said first pattern and the minimum feature size of said second pattern satisfy the following:

$$DOF(f_H)/2 + DOF(f_L)/2 \geq \Delta h$$

where $DOF(f_H)$ is a depth of focus of the image formation beam for forming an image having the minimum feature size of said first pattern, $DOF(f_L)$ is a depth of focus of the image formation beam for forming an image having the minimum feature size of said second pattern, and $\Delta h$ is a difference between the first and second heights.

3. A method as set forth in claim 1, wherein a focus of an image formed by the image formation beam is located between the first and second heights.

4. A method as set forth in claim 3, wherein a height $h_A$ of the focus of an image formed by the image formation beam satisfies the following:

$$DOF(f_H)/2 \geq |h_H - h_A|$$
$$DOF(f_L)/2 \geq |h_A - h_L|$$

where $f_H$ is the minimum feature size of said first pattern, $f_L$ is the minimum feature size of said second pattern, $DOF(f_H)$ is a depth of focus of the image formation beam for forming an image having the minimum feature size $f_H$, $DOF(f_L)$ is a depth of focus of the image formation beam for forming an image having the minimum feature size $f_L$, $h_H$ is the first height, and $h_L$ is the second height.

5. A method as set forth in claim 4, wherein the height $h_A$ is approximately $$|h_H - h_L| \times DOF(f_s)/(DOF(f_H) + DOF(f_L))$$

where $f_s = f_L$ if $h_H > h_L$ and $f_s = f_H$ if $h_H < h_L$.

6. A method for manufacturing a semiconductor device comprising the steps of:

forming a layer on a semiconductor substrate, said layer at least including a first portion having a first height and a second portion having a second height lower than the first height, and a third portion having a third height lower than the second height irradiating an image formation beam onto said layer, to form first, second and third patterns on said first, second and third portions, respectively, wherein a minimum feature size of one of said first pattern and said third pattern is the same as a minimum feature size of said second pattern.

7. A method as set forth in claim 6, wherein the minimum feature size of said second pattern is the same as that of said first pattern when the second height is closer to the first height than the third height, and wherein the minimum feature size of said second pattern is the same as that of said third pattern when the second height is closer to the third height than the first height.

8. A method as set forth in claim 6, wherein the minimum feature size of said first pattern and the minimum feature size of said third pattern satisfy the following:

$$DOF(f_H)/2 + DOF(f_L)/2 \geq h_H - h_L$$

where $DOF(f_H)$ is a depth of focus of the image formation beam for forming an image having the minimum feature size of said first pattern, $DOF(f_L)$ is a depth of focus of the image formation beam for forming an image having the minimum feature size of said third pattern, $h_H$ is the first height, and $h_L$ is the third height.

9. A method as set forth in claim 6, wherein a focus of an image formed by the image formation beam is located between the first and the third heights.

10. A method as set forth in claim 9, wherein a height $h_A$ of a center of an image formed by the image formation beam satisfies the following:

$$DOF(f_H)/2 \geq h_H - h_A$$

$$DOF(f_L)/2 \geq h_A - h_L$$

where $f_H$ is the minimum feature size of said first pattern, $f_L$ is the minimum feature size of said third pattern, $DOF(f_H)$ is a depth of focus of the image formation beam for forming an image having the minimum feature size $f_H$, $DOF(f_L)$ is a depth of focus of the image formation beam for forming an image having the minimum feature size $f_L$, $h_H$ is the first height, and $h_L$ is the third height.

11. A method as set forth in claim 10, wherein the height $h_A$ is approximately $$(h_H - h_L) \times DOF(f_L)/(DOF(f_H) + DOF(f_L)).$$

* * * * *